(12) United States Patent
Liu (10) Patent No.: US 7,649,741 B2
(45) Date of Patent: Jan. 19, 2010

(54) CASE STRUCTURE FOR CARD-TYPE ELECTRONIC PRODUCT

(75) Inventor: Wen-Han Liu, Taipei Hsien (TW)

(73) Assignee: Sunlit Precision Technology Co., Ltd. (TW)

( * ) Notice: Subject to any disclaimer, the term of this patent is extended or adjusted under 35 U.S.C. 154(b) by 0 days.

(21) Appl. No.: 12/170,912

(22) Filed: Jul. 10, 2008

(65) Prior Publication Data

US 2009/0015994 A1  Jan. 15, 2009

(30) Foreign Application Priority Data

Jul. 13, 2007 (TW) .............................. 96211499 U (51) Int. Cl.
*H05K 5/02* (2006.01)
(52) U.S. Cl. .................. 361/737; 361/730; 361/752; 235/492
(58) Field of Classification Search ................. 361/737, 361/752, 730; 174/50; 235/492
See application file for complete search history.

(56) References Cited

U.S. PATENT DOCUMENTS

| | | | | |
|---|---|---|---|---|
| 5,053,613 A | * | 10/1991 | Onoda | 235/492 |
| 6,166,913 A | * | 12/2000 | Fun et al. | 361/737 |
| 6,313,400 B1 | * | 11/2001 | Mosquera et al. | 174/363 |
| 6,341,729 B1 | * | 1/2002 | Lee | 235/492 |
| 6,431,729 B1 | * | 8/2002 | Chen | 362/249.01 |
| 6,877,995 B1 | * | 4/2005 | Chen | 439/76.1 |
| 6,992,901 B1 | * | 1/2006 | Hung | 361/818 |
| 7,049,172 B2 | * | 5/2006 | Wang et al. | 438/106 |
| 7,082,037 B2 | * | 7/2006 | Schremmer | 361/737 |
| 7,173,826 B1 | * | 2/2007 | Chiou et al. | 361/737 |
| 2005/0195581 A1 | * | 9/2005 | Chiou et al. | 361/752 |

* cited by examiner

*Primary Examiner*—Dameon E Levi
(74) *Attorney, Agent, or Firm*—Schmeiser, Olsen & Watts (57) ABSTRACT

A case structure for card-type electronic product includes an intermediate frame having insertion slots spaced thereon; a lower cover connected to a lower side of the intermediate frame by lower hooking members upward inserted into the insertion slots, and each of the lower hooking members including two spaced latch legs; and an upper cover connected to an upper side of the intermediate frame by upper hooking members downward inserted into the insertion slots corresponding to the lower hooking members, and each of the upper hooking members including two laterally outward extended latch hooks. When the upper and lower covers are assembled to the upper and lower sides of the intermediate frame, the latch hooks of the upper hooking members are abutted on lower edges of the latch legs of the lower hooking members to firmly hold the lower cover to the upper cover in three directions.

3 Claims, 7 Drawing Sheets

CASE STRUCTURE FOR CARD-TYPE ELECTRONIC PRODUCT

FIELD OF THE INVENTION

The present invention relates to a case structure for card-type electronic product, and more particularly to a case structure for card-type electronic product having simple but strong structure to enable reduced manufacturing cost and allowing easy disassembling thereof to enable necessary examination and repair of a half-finished electronic product.

BACKGROUND OF THE INVENTION

Figure 1:
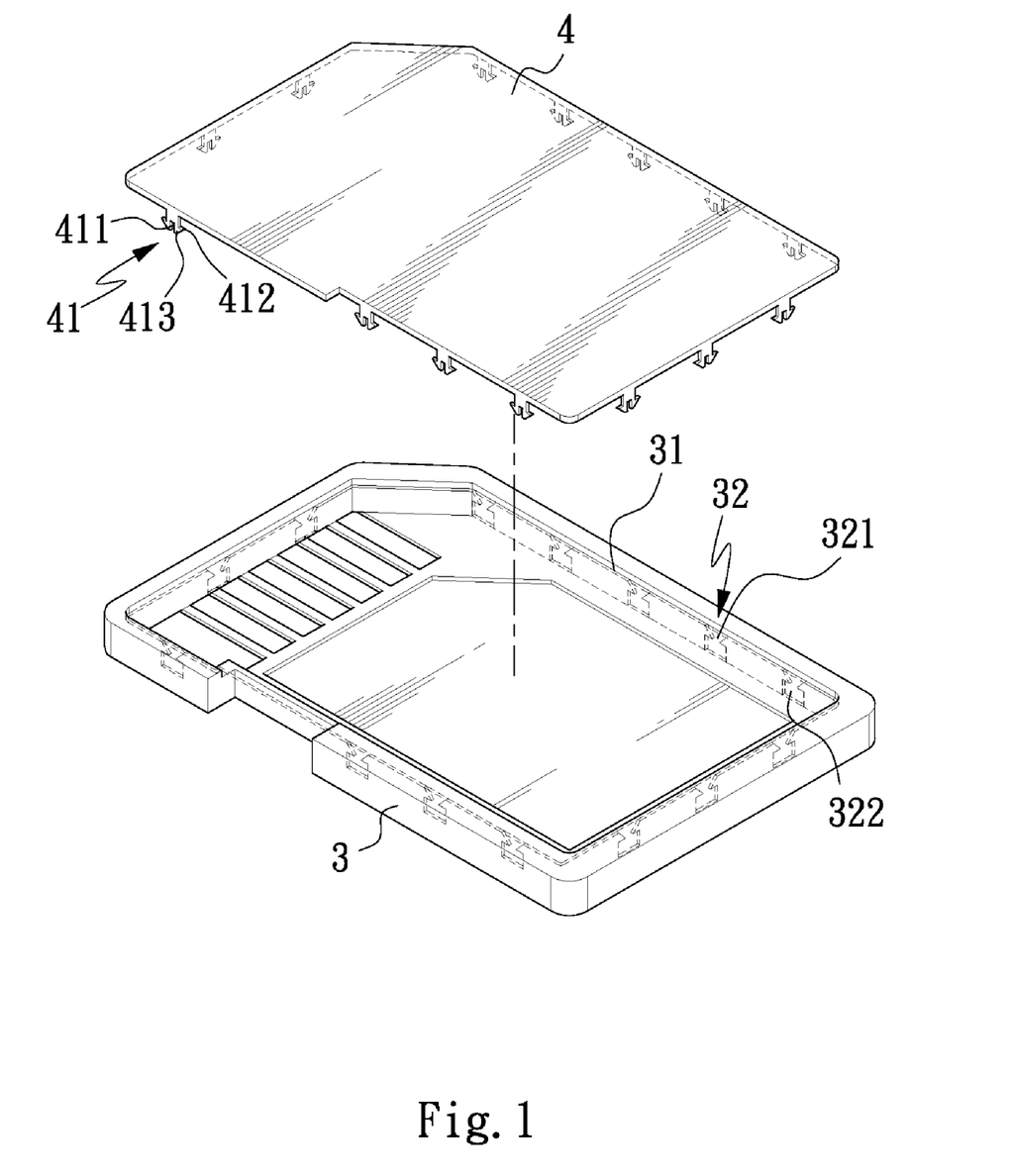
FIG. 1 is an exploded perspective view of a first conventional case structure for card-type electronic product.
Figure 2:
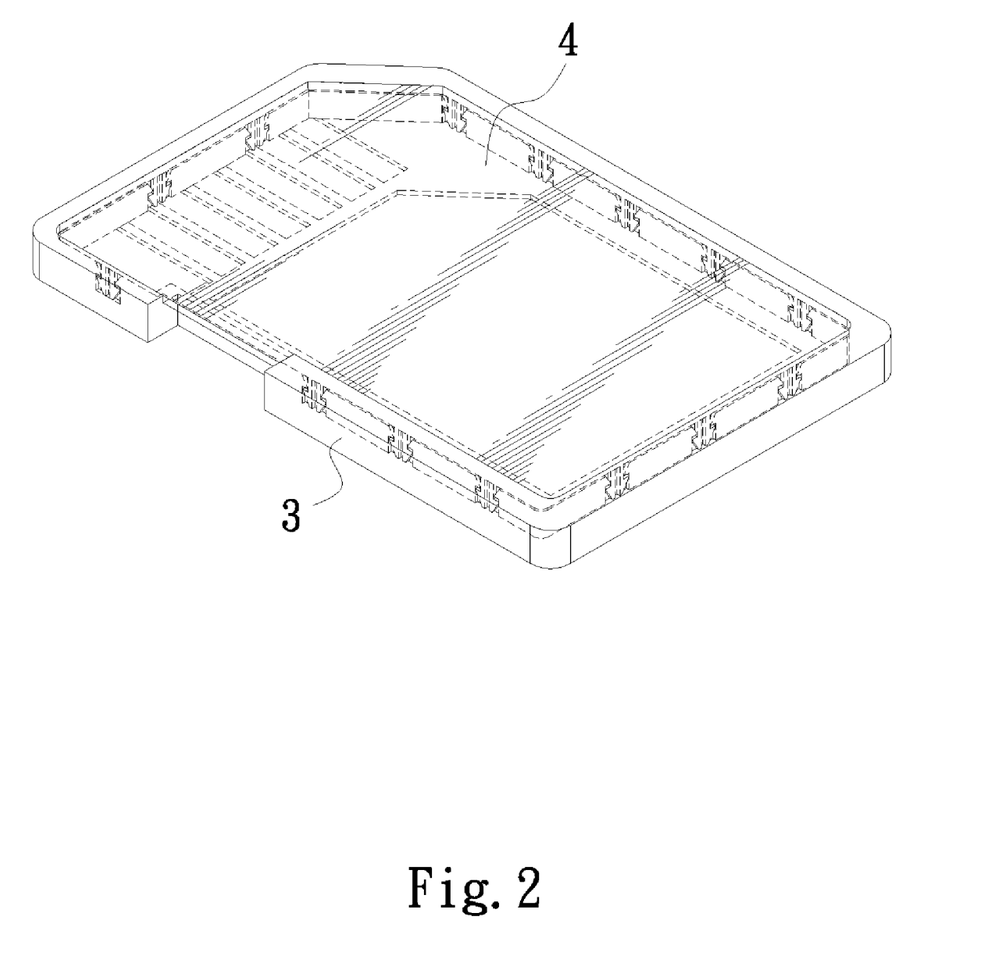
FIG. 2 is an assembled view FIG. 1.

FIGS. 1 and 2 are exploded and assembled perspective views, respectively, of a case structure for a flash memory card disclosed in Taiwanese Patent Publication No. 545656. As shown, the flash memory card case structure includes a base 3 and a cover 4. A groove 31 is formed along a periphery of the base 3. A plurality of retaining holes 32 is formed on an inner bottom of the groove 31 at predetermined intervals. Each of the retaining holes 32 includes an inward tapered upper hole 321 and a lower locating hole 322. A plurality of latch plates 41 are formed along a periphery of the cover 4 corresponding to the retaining holes 32 of the base 3. Each of the latch plates 41 has two laterally opposite L-shaped hooking legs 412 with a narrow space 411 existed between them. A curved section 413 is formed on an outer side of each of the hooking legs 412. Being guided by the curved sections 413, the hooking legs 412 of the latch plates 41 can be easily extended through the tapered upper holes 321 into the lower locating holes 322 of the retaining holes 32 and be held therein, so that the cover 4 is connected to the base 3 to form an integral case structure. However, in practice, the above-described structure has some defects as follows:

First, the hooking legs are made of a metal material while the base is made of a plastic material, which has a relatively weak mechanical strength compared to the metal material. Therefore, the plastic retaining holes tend to become worn out and even broken if an end user frequently inserts and extracts the metal hooking legs into and from the plastic retaining holes.

Second, since the cover is connected to the base via engagement of the hooking legs with the retaining holes in two directions in the same plane, the case structure is apt to break apart when it is carelessly dropped or subjected to a sideward impact.

Third, after the latch plates 41 of the cover 4 are inserted into the retaining holes 32 of the base 3, it is uneasy to extract the latch plates 41 from the retaining holes 32. In the event the latch plates 41 are forcedly extracted from the retaining holes 32, the lower locating holes 322 in the plastic groove 31 would become damaged. Therefore, the case structure of FIGS. 1 and 2 does not allow examination and repair of a half-finished electronic product.

Figure 3:
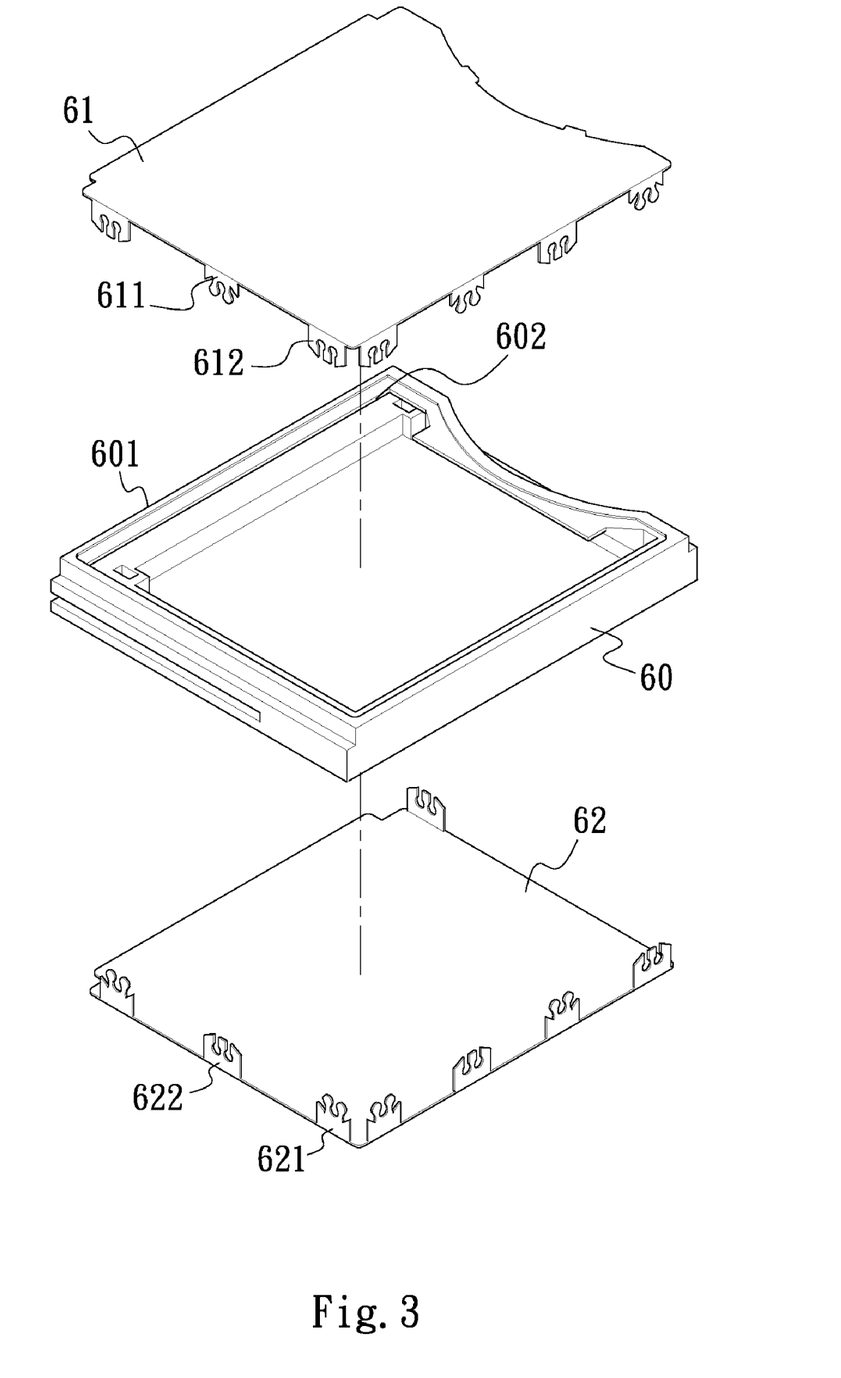
FIG. 3 is an exploded perspective view of a second conventional case structure for card-type electronic product.

FIG. 3 is an exploded perspective view of a case structure for a memory card receiving device disclosed in Taiwanese Patent Publication No. 549688. The memory card receiving device includes a rectangular intermediate frame 60, a top panel 61 connected to a top of the intermediate frame 60, and a bottom panel 62 connected to a bottom of the intermediate frame 60. A wall portion 601 is formed on each of four sides of the intermediate frame 60. A plurality of insertion slots 602 are formed on an inner side of each wall section 601. A plurality of complementary male and female latch plates 611, 612 are spaced along a periphery of the top panel 61 corresponding to the insertion slots 602. Also, a plurality of complementary male and female latch plates 621, 622 are spaced along a periphery of the bottom panel 62 corresponding to the insertion slots 602. When the top panel 61 and the bottom panel 62 are connected to the top and the bottom of the intermediate frame 60, respectively, with the latch plates inserted into the insertion slots 602, the male latch plates 611 and 621 are engaged with the female latch plates 622 and 612, respectively, in the insertion slots 602. The above-structured male and female latch plates have low binding strength. Therefore, the top panel 61 and the bottom panel 62 are not firmly locked to one another in the intermediate frame 60.

Figure 4:
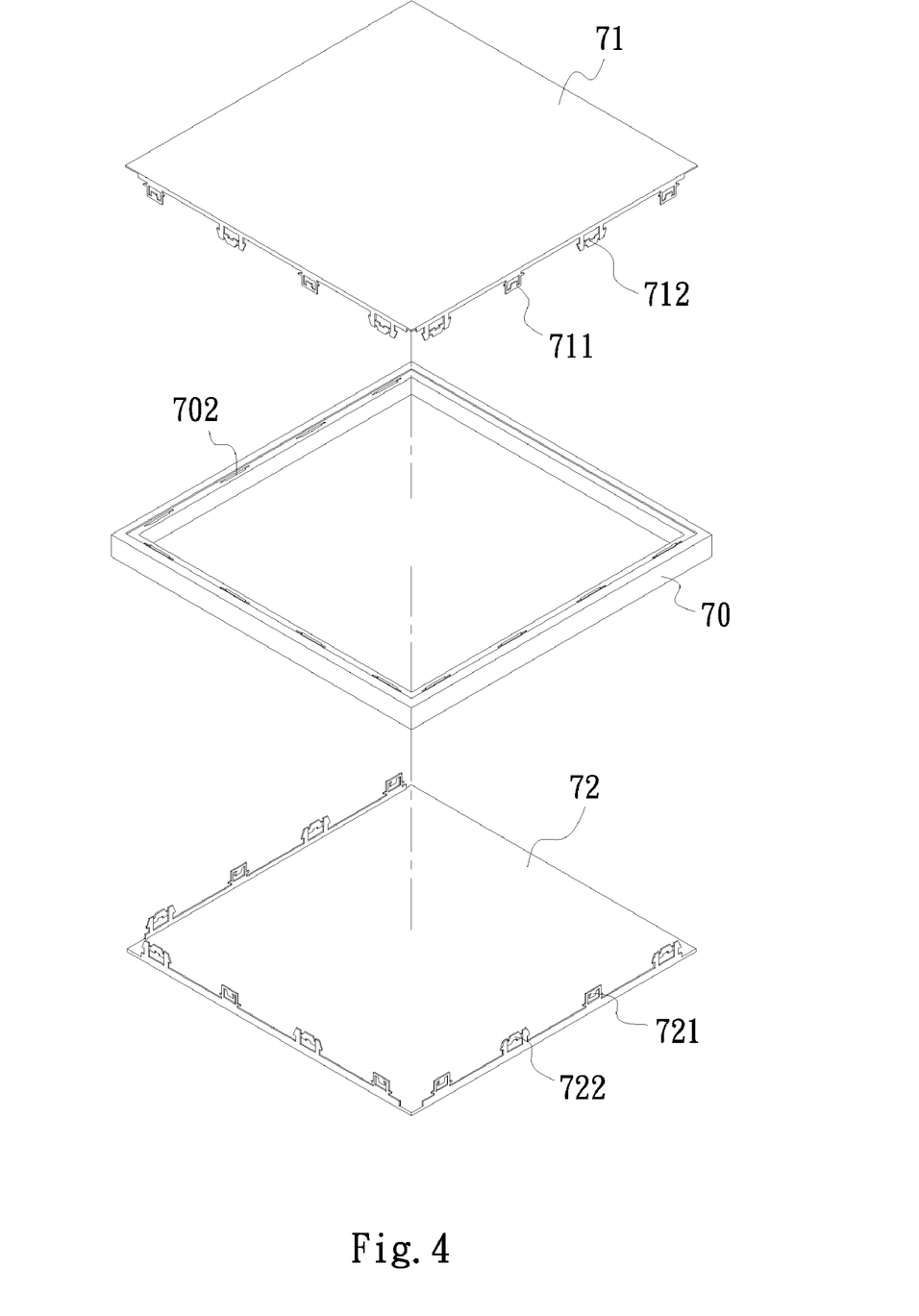
FIG. 4 is an exploded perspective view of a third conventional case structure for card-type electronic product.

FIG. 4 is an exploded perspective view of a conventional memory card case structure including an intermediate frame 70, a first cover 71, and a second cover 72. A plurality of insertion slots 702 are spaced along the intermediate frame 70 to extend in a thickness direction of the intermediate frame 70. A plurality of male and female latch plates 711, 712 is spaced along a periphery of the first cover 71. Also, a plurality of complementary female and male latch plates 722, 721 is spaced along a periphery of the second cover 72. When the first and second covers 71, 72 are connected to two opposite sides of the intermediate frame 70, the male and female latch plates 711, 721, 712, 722 are extended into the insertion slots 702 with the male latch plates 711 and 721 engaged with the female latch plates 722 and 712, respectively. In practice, the above-described structure has some shortcomings as follows:

First, the latch plates have complicated configurations and therefore require complicated punching dies to manufacture the first and the second cover 71, 72. As a result, the memory card case structure requires higher designing and manufacturing costs and longer manufacturing time to adversely affect the product development.

Second, the latch plates have complicated configurations and require high accuracy to enable correct assembly of the half-finished and finished products with a tolerance less than 0.10 mm. This leads to increased manufacturing cost and has adverse influence on the competition ability of the products in the market.

It is therefore tried by the inventor to develop a case structure for card-type electronic product to eliminate the drawbacks in the conventional similar products.

SUMMARY OF THE INVENTION

A primary object of the present invention is to provide an improved case structure for card-type electronic product that has simple but strong structure to enable reduced manufacturing cost thereof.

Another object of the present invention is to provide a case structure for card-type electronic product that allows easy disassembling thereof to allow necessary examination and repair in the process of assembling a half-finished electronic product.

A further object of the present invention is to provide a case structure for card-type electronic product that has simple structure and therefore requires only simple punching dies to effectively reduce the manufacturing cost thereof.

To achieve the above and other objects, the case structure for card-type electronic product according to the present invention includes an intermediate frame, a lower cover, and an upper cover.

The intermediate frame defines a receiving space therein and has a plurality of insertion slots spaced thereon to extend from an upper side to a lower side thereof. Each of the insertion slots has a rectangular cross section and includes an upper portion and a lower portion, and the upper portion has a length longer than that of the lower portion.

The lower cover is detachably connected to the lower side of the intermediate frame and has a plurality of upward extended lower hooking members spaced along a periphery thereof for inserting into the insertion slots from a lower side thereof. Each of the lower hooking members includes two latch legs, each of which having an obliquely outward and downward extended upper end to define a beveled surface.

The upper cover is detachably connected to the upper side of the intermediate frame and has a plurality of downward extended upper hooking members spaced along a periphery thereof corresponding to the lower hooking members of the lower cover. Each of the upper hooking members has a bottom formed into two laterally outward extended latch hooks having some elasticity, and the latch hooks each have a free end inward bent by a certain extent toward the upper cover.

When the upper cover is assembled to the upper side of the intermediate frame, the upper hooking members are downward inserted into the insertion slots with the inward bent free ends of the latch hooks of the upper hooking members abutted on lower edges of the latch legs of the lower hooking members to thereby firmly hold the lower cover to the upper cover.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Please refer to FIGS. 5 to 8, in which a case structure for card-type electronic product according to a preferred embodiment of the present invention is shown. As shown, the case structure includes an intermediate frame 1, a lower cover 2 connected to a lower side of the intermediate frame 1, and an upper cover 5 connected to an upper side of the intermediate frame 1.

The intermediate frame 1 defines a receiving space 11 therein, and has a plurality of insertion slots 12 spaced thereon to extend from the upper side to the lower side thereof. Each of the insertion slots 12 has a rectangular cross section and includes an upper portion and a lower portion. The upper portion has a length longer than that of the lower portion, as can be seen from FIG. 7.

Figure 5:
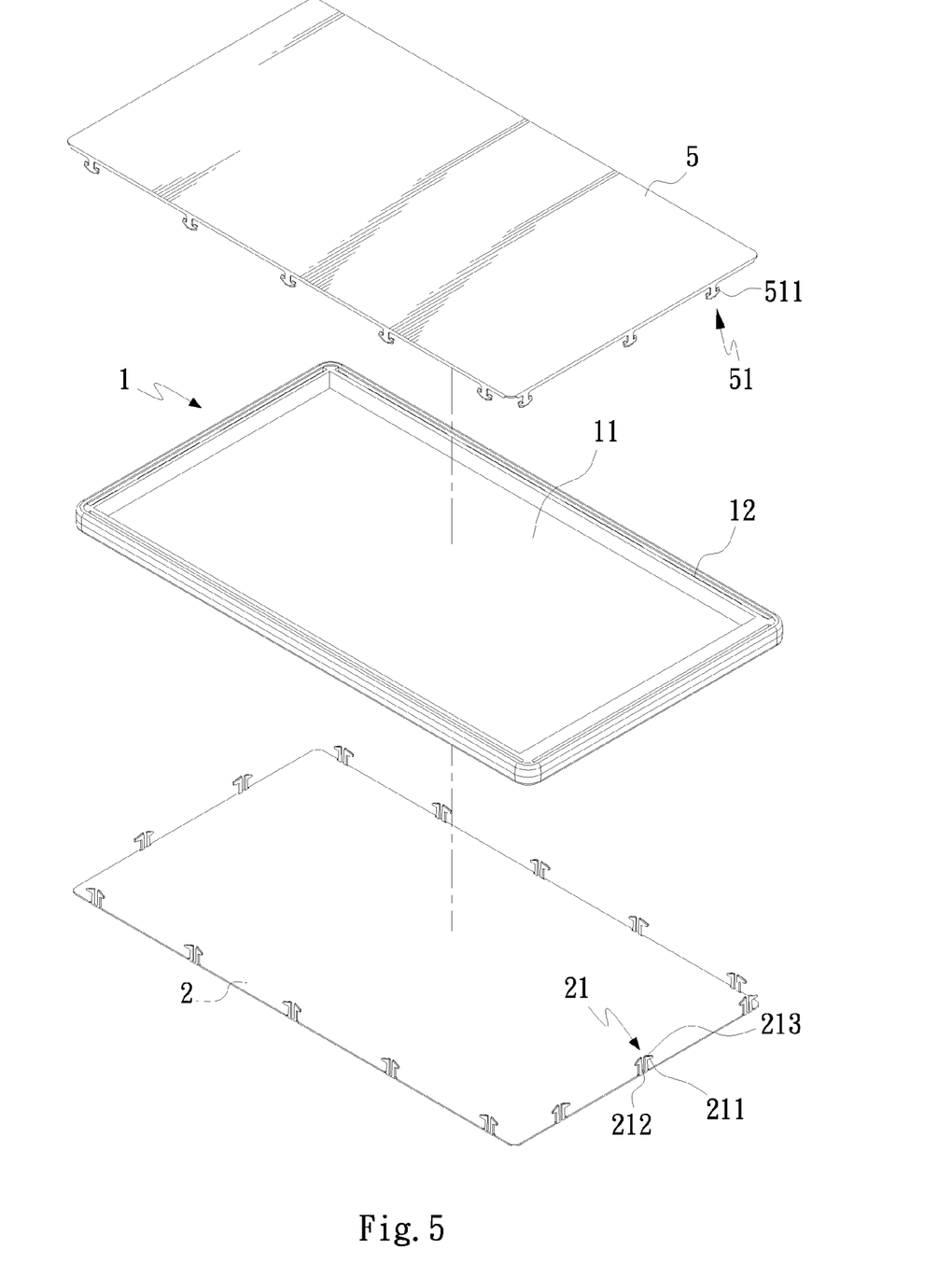
FIG. 5 is an exploded perspective view of a case structure for card-type electronic product according to a preferred embodiment of the present invention.
Figure 6:
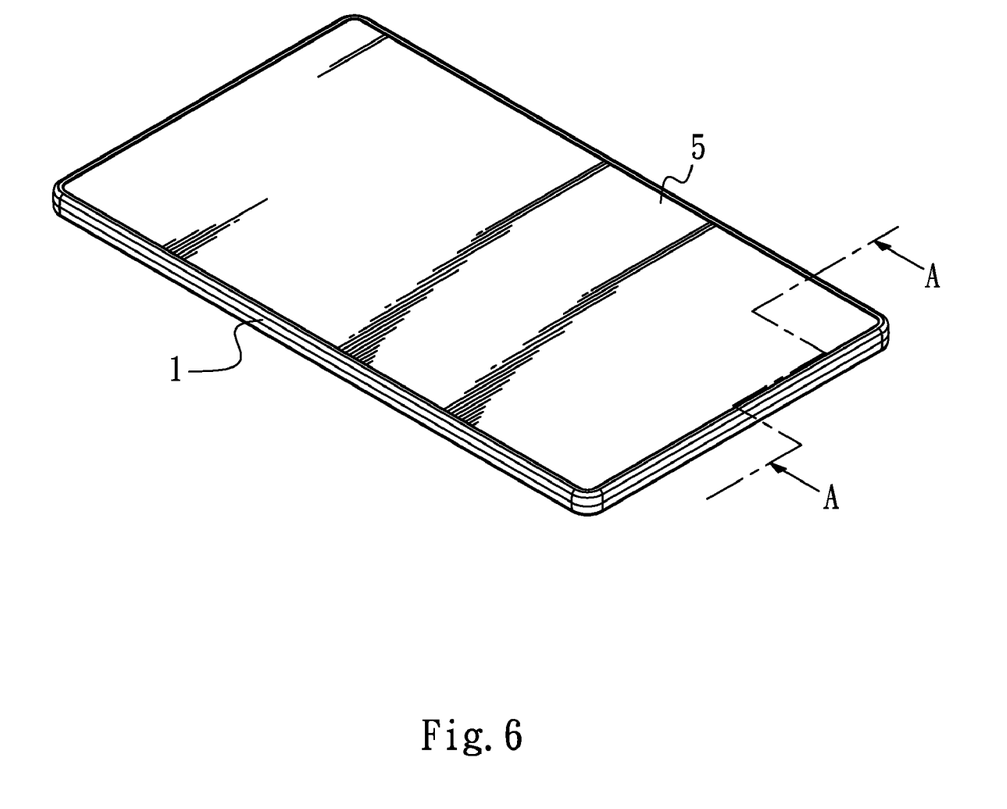
FIG. 6 is an assembled view of FIG. 5.
Figure 7:
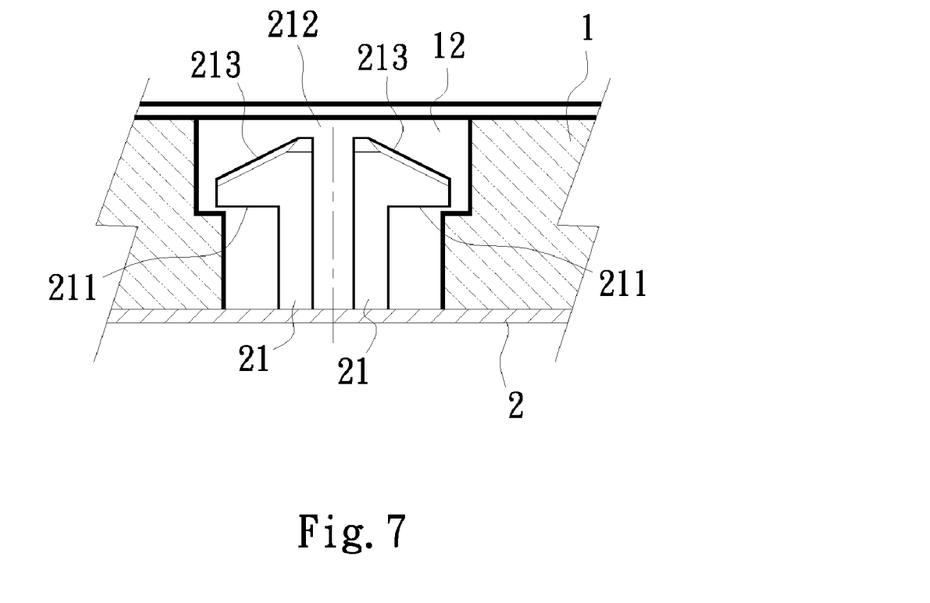
FIG. 7 is a fragmentary sectional view of the present invention showing the connection of a lower cover to an intermediate frame thereof.

The lower cover 2 has a plurality of upward extended lower hooking members 21 spaced along a periphery thereof. Each of the lower hooking members 21 includes two latch legs 211 with a narrow space 212 existed between them, enabling the two latch legs 211 to resiliently bias toward each other under a pressure. Each of the latch legs 211 has an obliquely outward and downward extended upper end to define a beveled top surface 213.

The upper cover 5 also has a plurality of downward extended upper hooking members 51 spaced along a periphery thereof corresponding to the lower hooking members 21 on the lower cover 2. Each of the upper hooking members 51 has a bottom formed into two laterally outward extended latch hooks 511 having some elasticity. The latch hooks 511 have free ends inward bent by a certain extent toward the upper cover 5.

To assemble the lower cover 2 to the intermediate frame 1, simply insert the lower hooking members 21 into the insertion slots 12 from the shorter lower portion thereof. Please refer to FIG. 7. When the beveled top surfaces 213 on each of the lower hooking members 21 are in contact with the shorter lower portion of the insertion slot 12, the narrow space 212 allow the two latch legs 211 of the lower hooking member 21 to resiliently bias toward each other, allowing the lower hooking member 21 to easily move into the insertion slot 12. When the latch legs 211 have passed through the shorter lower portion into the longer upper portion of the insertion slot 12, the two latch legs 211 automatically spring outward to hook to a shoulder portion formed between the upper and the lower portion of the insertion slot 12. At this point, the lower cover 2 is preliminarily associated with the intermediate frame 1, and electronic elements (not shown) can be mounted on the lower cover 2 in the receiving space 11 of the intermediate frame 1.

In the event the lower cover 2 must be disassembled from the intermediate frame 1 in subsequent electronic element tests, simply use a hand tool, such as a pair of pliers, to clamp the two latch legs 211 of the lower hooking member 21 together, so that the lower cover 2 can be disassembled from the intermediate frame 1 for necessary examination and/or repair.

Figure 8:
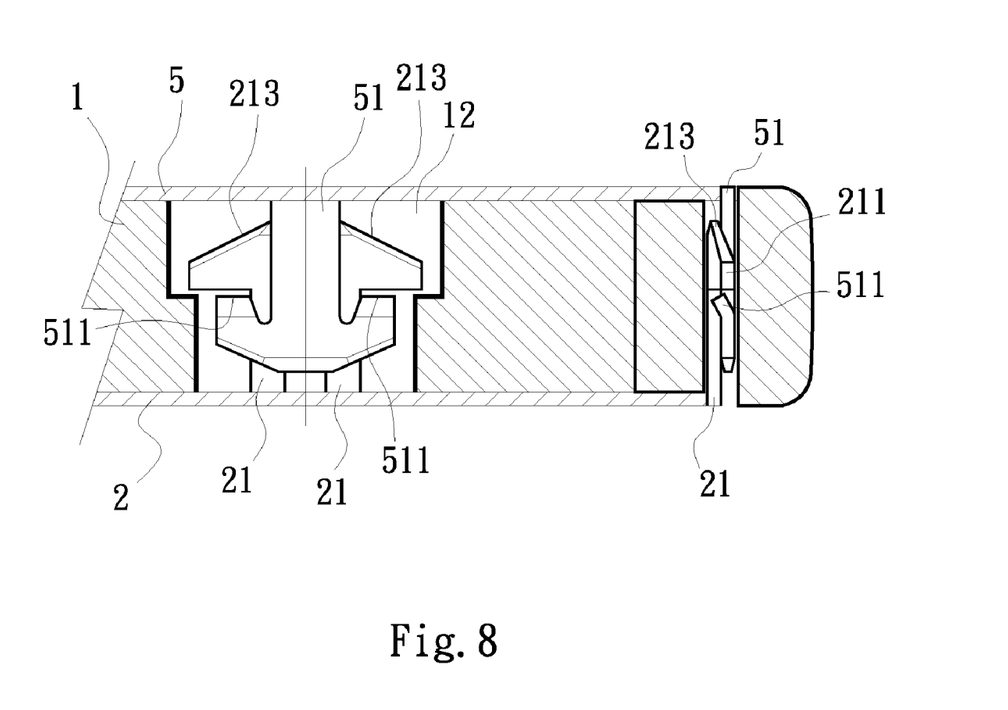
FIG. 8 is an enlarged sectional view taken along line A-A of FIG. 6.

On the other hand, the upper cover 5 is assembled to the intermediate frame 1 simply by downward inserting the upper hooking members 51 into the insertion slots 12 from the longer upper portion thereof. When the latch hooks 511 on each of the upper hooking members 51 touch the latch legs 211 of the lower hooking member 21 in the same insertion slot 12, the latch hooks 511 and the latch legs 211 are resiliently biased, allowing the latch hooks 511 to easily slide downward between one side of the latch legs 211 and insertion slot 12 with the inward bent free ends of the latch hooks 511 abutted on lower edges of the latch legs 211, as shown in FIG. 8. In this manner, the latch hooks 511 and the latch legs 211 are locked together in three directions, making the upper cover 5 and the lower cover 2 firmly held to the upper and the lower side of the intermediate frame 1, respectively.

In brief, the case structure for card-type electronic product according to the present invention has simple structure but high structural strength, and can be manufactured at reduced cost. In addition, the case structure of the present invention can be disassembled to allow necessary examination and repair of the half-finished card-type electronic product without damaging the hooking members thereof.

The present invention has been described with a preferred embodiment thereof and it is understood that many changes and modifications in the described embodiment can be carried out without departing from the scope and the spirit of the invention that is intended to be limited only by the appended claims.

What is claimed is:

1. A case structure for card-type electronic product, comprising:

an intermediate frame defining a receiving space therein, and having a plurality of insertion slots spaced thereon to extend from an upper side to a lower side thereof;

a lower cover being detachably connected to the lower side of the intermediate frame and having a plurality of upward extended lower hooking members spaced along a periphery thereof for inserting into the insertion slots from a lower side thereof; and each of the lower hooking members including two latch legs sidewardly extended in two opposite directions, wherein each of the latch legs has an obliquely outward and downward extended upper end to define a beveled top surface; and an upper cover being detachably connected to the upper side of the intermediate frame and having a plurality of downward extended upper hooking members spaced along a periphery thereof corresponding to the lower hooking members of the lower cover; each of the upper hooking members having a bottom formed into two laterally outward extended latch hooks having some elasticity, the latch hooks each having a free end inward bent by a certain extent toward the upper cover, and each of the upper hooking members consisting of only a single member;

whereby when the upper cover is assembled to the upper side of the intermediate frame, the upper hooking members are downward inserted into the insertion slots with the inward bent free ends of the latch hooks of the upper hooking members abutted on lower edges of the latch legs of the lower hooking members to hold the lower cover to the upper cover, wherein each of the upper hooking members is locked in between two latch legs of the lower hooking member in three different directions.

2. The case structure of the card-type electronic product as claimed in claim 1, wherein each of the lower hooking members has a longitudinally extended narrow space formed between the two latch legs.

3. The case structure of the card-type electronic product as claimed in claim 1, wherein each of the lower hooking members has a longitudinally extended narrow space formed between the two latch legs.

* * * * *